(12) United States Patent
Kobayashi et al.

(10) Patent No.: US 11,108,214 B2
(45) Date of Patent: Aug. 31, 2021

(54) WAVELENGTH COMBINING LASER APPARATUS

(71) Applicant: Mitsubishi Electric Corporation, Tokyo (JP)

(72) Inventors: Nobutaka Kobayashi, Tokyo (JP); Tomotaka Katsura, Tokyo (JP); Daiji Morita, Tokyo (JP); Junichi Nishimae, Tokyo (JP); Tomohiro Kyoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 191 days.

(21) Appl. No.: 16/481,540

(22) PCT Filed: Jan. 12, 2018

(86) PCT No.: PCT/JP2018/000709
§ 371 (c)(1),
(2) Date: Jul. 29, 2019

(87) PCT Pub. No.: WO2018/163598
PCT Pub. Date: Sep. 13, 2018

(65) Prior Publication Data
US 2020/0028332 A1    Jan. 23, 2020

(30) Foreign Application Priority Data
Mar. 9, 2017   (JP) ............... JP2017-045319

(51) Int. Cl.
*H01S 5/40* (2006.01)
*H01S 3/08* (2006.01)
*H01S 5/14* (2006.01)

(52) U.S. Cl.
CPC ........ *H01S 5/4012* (2013.01); *H01S 3/08054* (2013.01); *H01S 3/08059* (2013.01);
(Continued)

(58) Field of Classification Search
CPC ...... H01S 5/4012; H01S 5/141; H01S 5/4025; H01S 3/08054; H01S 3/08059; H01S 5/143; H01S 5/4031
See application file for complete search history.

(56) References Cited

U.S. PATENT DOCUMENTS 4,003,059 A    1/1977  Sugiura et al.
6,163,012 A   12/2000  Kimura et al.
(Continued)

FOREIGN PATENT DOCUMENTS

CN      1761549 A      4/2006
JP    S50110306 A      8/1975
(Continued)

OTHER PUBLICATIONS

Office Action dated Aug. 21, 2020, issued in corresponding Chinese Patent Application No. 201880015868.5, 16 pages including 8 pages of English translation.
(Continued)

*Primary Examiner* — Yuanda Zhang
(74) *Attorney, Agent, or Firm* — Buchanan Ingersoll & Rooney PC (57) ABSTRACT

A wavelength combining laser apparatus includes: a semiconductor laser emitting laser beams in an optical-axial direction perpendicular to a laser beam combining direction; a wavelength combining element combining the laser beams in the laser beam combining direction into a single laser beam; a cross-coupling reduction optical system having positive power in the laser beam combining direction perpendicular to an optical axis of the single laser beam output from the wavelength combining element; and a partially-reflective mirror reflecting the single laser beam having passed through the cross-coupling reduction optical system and also allowing the single laser beam to transmit through and exit the partially-reflective mirror. The cross-coupling
(Continued)

reduction optical system is disposed to image the light emitting end face on the partially-reflective mirror by causing the light emitting end face to be conjugate to the partially-reflective mirror in a plane formed by the optical axis and the laser beam combining direction.

14 Claims, 8 Drawing Sheets

(52) U.S. Cl.
CPC .............. *H01S 5/141* (2013.01); *H01S 5/143* (2013.01); *H01S 5/4025* (2013.01); *H01S 5/4031* (2013.01)

(56) References Cited

U.S. PATENT DOCUMENTS

| | | | |
|---|---|---|---|
| 6,192,062 | B1 | 2/2001 | Sanchez-Rubio et al. |
| 6,665,471 | B1 | 12/2003 | Farmer et al. |
| 9,256,073 | B2 | 2/2016 | Chann et al. |
| 2004/0228004 | A1 | 11/2004 | Sercel et al. |
| 2008/0242056 | A1 | 10/2008 | Sercel et al. |
| 2010/0110556 | A1 | 5/2010 | Chann et al. |
| 2010/0301027 | A1 | 12/2010 | Sercel et al. |
| 2012/0002272 | A1 | 1/2012 | Chann et al. |
| 2013/0208361 | A1* | 8/2013 | Chann ................ G02B 5/18 359/615 |
| 2015/0303656 | A1 | 10/2015 | Morita et al. |
| 2015/0333485 | A1 | 11/2015 | Tayebati et al. |
| 2016/0111850 | A1 | 4/2016 | Muendel et al. |
| 2016/0268761 | A1 | 9/2016 | Tayebati et al. |
| 2017/0207605 | A1 | 7/2017 | Morita et al. |
| 2018/0083412 | A1 | 3/2018 | Tayebati et al. |
| 2018/0175590 | A1 | 6/2018 | Yamamoto et al. |

FOREIGN PATENT DOCUMENTS

| | | |
|---|---|---|
| JP | H10216983 A | 8/1998 |
| JP | 2006514886 A | 5/2006 |
| JP | 2008103604 A | 5/2008 |
| JP | 2010225932 A | 10/2010 |
| JP | 2012508453 A | 4/2012 |
| JP | 2014120560 A | 6/2014 |
| JP | 2014216361 A | 11/2014 |
| JP | 2015513792 A | 5/2015 |
| JP | 2016096333 A | 5/2016 |
| JP | 2016111339 A | 6/2016 |
| WO | 2004075174 A2 | 9/2004 |
| WO | 2014087726 A1 | 6/2014 |
| WO | 2016013653 A1 | 1/2016 |
| WO | 2017022142 A1 | 2/2017 |

OTHER PUBLICATIONS

Japanese Office Action dated Feb. 12, 2020 issued by the Japanese Patent Office in Japanese Patent Application No. 2019-504353, with English translation (18 pages).

International Search Report (PCT/ISA/210) dated Apr. 3, 2018, by the Japan Patent Office as the International Searching Authority for International Application No. PCT/JP2018/000709.

Written Opinion (PCT/ISA/237) dated Apr. 3, 2018, by the Japan Patent Office as the International Searching Authority for International Application No. PCT/JP2018/000709.

Schroder, G., "Technische Optik", 7th Edition, p. 138, 1990, with English translation (6 pages).

German Office Action dated Sep. 25, 2020 issued by the German Patent Office in German Patent Application No. 11 2018 001 247.6, with English translation (12 pages).

* cited by examiner

WAVELENGTH COMBINING LASER APPARATUS

FIELD

The present invention relates to a wavelength combining laser apparatus for combining laser beams emitted from a plurality of light emitting portions of a semiconductor laser.

BACKGROUND

As an example of a laser oscillator for combining light emitted from many semiconductor laser diodes (LDs) (such light is hereinafter referred to as LD beams), there exists a resonator of a wavelength combining type that uses a diffraction grating as a wavelength combining element.

In recent years, the LD beam having a wavelength in a 900 nm band or a 1000 run band and a high electro-optical conversion efficiency is directly used for processing such as cutting or welding of metal. In these applications, however, there is a limit to the output of a single LD beam, that is, the light emitted from an active layer stripe that is one light emitting layer of a semiconductor element, so that LD beams from a plurality of light emitting layers are collected and used in order to obtain a high-power laser beam.

Moreover, the cutting processing in particular requires high beam quality, that is, high light focusing performance, so that the plurality of LD beams are not just collected but combined. The processing such as cutting or welding of metal requires laser output of several hundreds of W to several kW, and an LD bar provided with a plurality of light emitting layers is convenient for obtaining a plurality of LD beams. Specifically, the light emitting layers each having a width of 50 μm to 200 μm are arranged at equal pitches in the LD bar having a width of about 10 mm, and 10 to 50 laser beams are emitted from the end face thereof. The output of several tens of W is obtained from such an LD bar, and an LD bar outputting several hundreds of W is also available in recent years.

The resonator of the wavelength combining type is prone to cross-coupling oscillation or so-called cross-talk that lowers the beam quality and the electro-optical conversion efficiency. The resonator of the wavelength combining type superimposes a large number of LD beams emitted from the LD bar to obtain a single combined laser beam of high power and multiple wavelengths. Such wavelength combining uses an external resonator optical path including the wavelength combining element, where an LD beam reflected by a partially-reflective mirror is in some cases not fed back to the light emitting layer from which the LD beam has been emitted but is fed back to another light emitting layer such as an adjacent light emitting layer. At this time, laser oscillation occurs between different light emitting layers such as adjacent light emitting layers. Such laser oscillation is the cross-coupling oscillation.

In order to reduce such cross-coupling oscillation, Patent Literature 1 states that it is sufficient if a partially-reflecting output coupler, that is, a partially-reflective mirror, is disposed within the Rayleigh range of a laser beam after a cross-coupling mitigation system.

CITATION LIST

Patent Literature

Patent Literature 1: U.S. Pat. No. 9,256,073

SUMMARY

Technical Problem

However, the method described in Patent Literature 1 cannot prevent the cross-coupling oscillation. Patent Literature 1 sets Lcplr_eff, which is the distance from a diffraction grating to the partially-reflective mirror, to be greater than or equal to Zr, which is the Rayleigh range of the laser beam after the lens. Moreover, a specific value of Zr is 160 m, which is unrealistic, so that the partially-reflective mirror is disposed by reducing the distance to a realistic distance of about 1 m using an afocal telescope. However, the position of the partially-reflective mirror that can reduce the cross-coupling oscillation does not occur in such a wide range in reality but occurs only at a very narrow pinpoint. Thus, for preventing the cross-coupling oscillation, it is insufficient to just dispose the partially-reflective mirror within the Rayleigh range of the laser beam after the cross-coupling mitigation system. Moreover, the cross coupling oscillation cannot be prevented with the afocal telescope.

The present invention has been made in view of the above, and an object of the present invention is to provide a wavelength combining laser apparatus that does not generate cross-coupling oscillation and has high beam quality and high electro-optical conversion efficiency.

Solution to Problem

In order to solve the above problem and achieve the object, an aspect of the present invention is directed to a wavelength combining laser apparatus including: a semiconductor laser to emit, in a direction of an optical axis, a plurality of laser beams from a light emitting end face of a plurality of light emitting portions aligned in a laser beam combining direction, the direction of the optical axis being perpendicular to the laser beam combining direction; a wavelength combining element to combine the plurality of laser beams in the laser beam combining direction into a single laser beam and output the single laser beam; a cross-coupling reduction optical system having a positive power in the laser beam combining direction perpendicular to an optical axis of the single laser beam that is output from the wavelength combining element; and a par tally-reflective mirror to reflect the single laser beam that passes through the cross-coupling reduction optical system and to allow the single laser beam to transmit through and exit the partially-reflective mirror. Further, in an aspect of the present invention, the cross-coupling reduction optical system is disposed to image the light emitting end face on the partially-reflective mirror by causing the light emitting end face to be conjugate to the partially-reflective mirror in a plane formed by the optical axis of the single laser beam and the laser beam combining direction.

Advantageous Effects of Invention

The present invention produces an effect in which it is possible to provide a wavelength combining laser apparatus that does not generate cross-coupling oscillation and has high beam quality and high electro-optical conversion efficiency.

DESCRIPTION OF EMBODIMENTS

A wavelength combining laser apparatus according to embodiments of the present invention will now be described in detail with reference to the drawings. Note that the present invention is not limited to the embodiments.

First Embodiment

Figure 1:
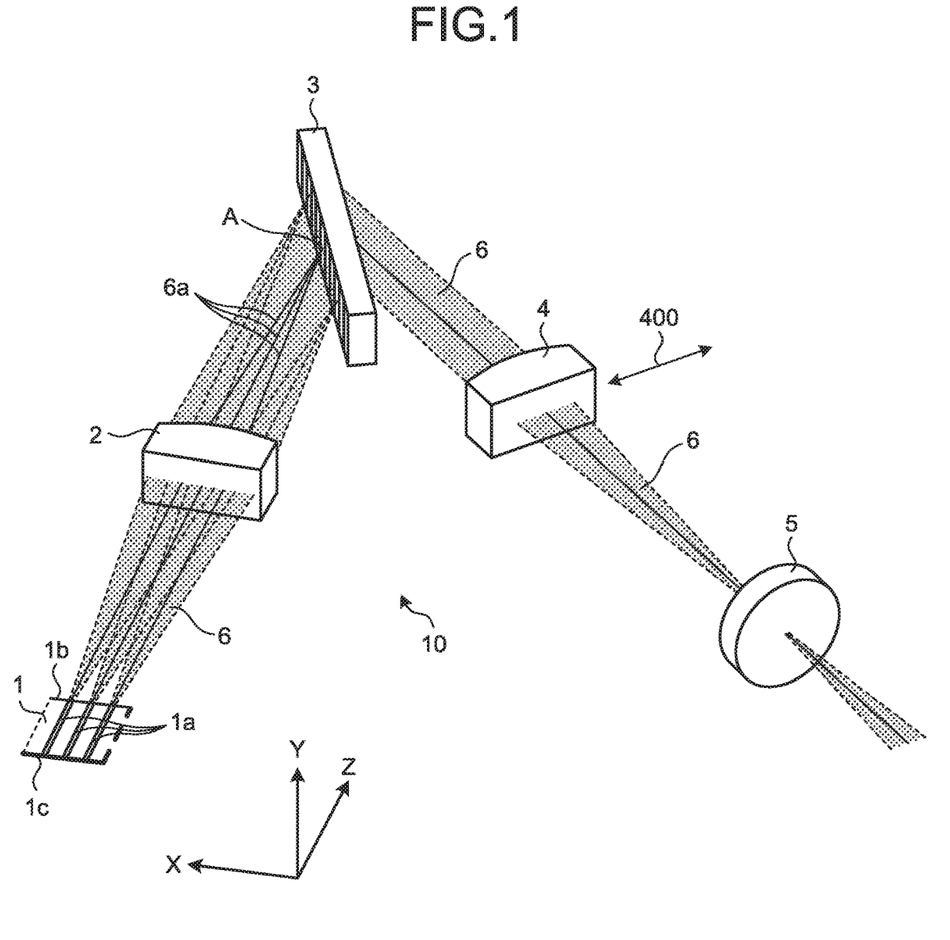
FIG. 1 is a diagram illustrating the configuration of a wavelength combining laser apparatus according to a first embodiment of the present invention.

FIG. 1 is a diagram illustrating the configuration of a wavelength combining laser apparatus 10 according to a first embodiment of the present invention. The wavelength combining laser apparatus 10 includes an LD bar 1 that is a semiconductor laser including a plurality of light emitting layers 1a as light emitting portions; a focusing element 2; a wavelength combining element 3; a cross-coupling reduction optical system 4; and a partially-reflective mirror 5. A specific example of each of the focusing element 2 and the cross-coupling reduction optical system 4 is a lens. A specific example of the wavelength combining element 3 is a diffraction grating.

Around 10 to 50 of the light emitting layers 1a are provided in the LD bar 1 and arranged at equal pitches in the width direction of the LD bar 1. The width direction of the LD bar 1 corresponds to the laser beam combining direction in which the wavelength combining element 3 combines laser beams 6. FIG. 1 illustrates only three of the light emitting layers 1a for simplicity. The laser beam 6 is emitted from a light emitting end face 1b of each of the light emitting layers 1a in the direction of an optical axis perpendicular to the laser beam combining direction. The laser beam combining direction is the direction with respect to the optical axis of the laser beam 6 and is defined as the direction perpendicular to both the optical axis and the thickness direction of the LD bar 1. Thus, when the direction of the optical axis is changed by the wavelength combining element 3 as described later, the laser beam combining direction is also changed. Here, the width direction of the LD bar 1 in which the light emitting layers 1a are arranged is defined as an X direction, the thickness direction of the LD bar 1 as a Y direction, and the direction in which the laser beam 6 is emitted as a Z direction.

The LD bar 1 is fabricated by performing a semiconductor process such as lithography on an InGaAs substrate or an AlGaAs substrate. FIG. 1 omits a heat sink for cooling the LD bar 1, a submount for connecting the LD bar 1 to the heat sink, and an electrode and a gold wire for conduction.

When the focusing element 2 is formed of a lens, the focusing element 2 is made of quartz or glass and has a convex power, that is, a positive power, in at least the laser beam combining direction (X direction). The focusing element 2 collimates the laser beams 6 that are emitted from the light emitting layers 1a and propagate while diverging. At the same time, the focusing element 2 collects chief rays 6a of the laser beams 6 at one point A on the wavelength combining element 3.

When the wavelength combining element 3 is formed of a diffraction grating, the wavelength combining element 3 diffracts the laser beams 6, the chief rays 6a of which are collected at one point A, in the first-order diffraction direction. Note that the direction in which the wavelength combining element 3 diffracts the laser beams 6 is not limited to the first-order diffraction direction.

The laser beams 6 diffracted by the wavelength combining element 3 are transmitted through the cross-coupling reduction optical system 4 and partially reflected by the partially-reflective mirror 5. The portions of the laser beams 6 reflected by the partially-reflective mirror 5 go back to the cross-coupling reduction optical system 4, the wavelength combining element 3, and the focusing element 2 along the optical path in a direction opposite to the direction in which the beams have propagated so far, and are fed back to the corresponding light emitting layers 1a from which the laser beams 6 have been emitted.

That is, the wavelength combining laser apparatus 10 is a resonator with the light emitting layers 1a as an oscillation source that is a gain medium, an end face 1c of the LD bar 1 opposite to the light emitting end face 1b as a total reflection mirror, and the partially-reflective mirror 5 as a mirror facing the end face 1c. The portion from the focusing element 2 to the partially-reflective mirror 5 outside the LD bar 1 is called an external resonator optical path.

Figure 2:
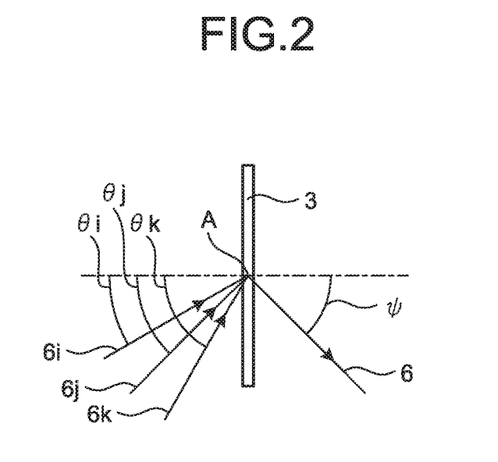
FIG. 2 is a diagram illustrating the behavior of a plurality of laser beams in a wavelength combining element according to the first embodiment.

Next, combining of the plurality of laser beams 6, that is, wavelength combining, will be described. FIG. 2 is a diagram illustrating the behavior of the plurality of laser beams 6 in the wavelength combining element 3 according to the first embodiment. FIG. 2 illustrates the plurality of laser beams 6 as three chief rays 6i, 6j, and 6k for simplicity. The chief rays 6i, 6j, and 6k are collected at one point A on the wavelength combining element 3 by the focusing element 2.

Incident angles of the chief rays 6i, 6j, and 6k to the wavelength combining element 3 are determined to be θi, θj, and θk, respectively, on the basis of the pitch of the light emitting layers 1a in the LD bar 1, the focal length of the focusing element 2, and the angle of placement of the wavelength combining element 3.

In order for the chief rays 6i, 6j, and 6k to be fed back to the corresponding light emitting layers 1a from which the rays have been emitted, the chief rays 6i, 6j, and 6k need to enter the partially-reflective mirror 5 at a right angle and be reflected thereby at a right angle after being diffracted by the wavelength combining element 3. From such conditions, the outgoing angles, that is, diffraction angles, of the chief rays 6i, 6j, and 6k from the wavelength combining element 3 are all determined to be the same angle ψ.

The wavelengths of the chief rays 6i, 6j, and 6k are determined to be λi, λj, and λk, respectively, on the basis of the incident angles θi, θj, and θk and the outgoing angle ψ determined as described above.

That is, the wavelength at which the laser beam 6 emitted from each of the light emitting layers 1a can oscillate is automatically selected so that the wavelength combining laser apparatus 10 oscillates. At this time, the wavelength increases from λi to λk as the incident angle increases from θi to θk, whereby the wavelengths of the laser beams 6 emitted from the light emitting layers 1a are shifted gradually and discretely along the X direction of the LD bar 1.

The outgoing angle ψ of the laser beam 6 from the wavelength combining element 3 is fixed regardless of the magnitude of the incident angle. In other words, the wavelength combining element 3 combines the plurality of laser beams 6 in the X direction that is the laser beam combining direction, and outputs a single laser beam 6. As a result, the laser beams 6 of all wavelengths are superimposed into the single beam between the wavelength combining element 3 and the partially-reflective mirror 5, whereby the wavelength combining laser apparatus 10 emits a single multi-wavelength combined laser beam from the partially-reflective mirror 5.

When the cross-coupling reduction optical system. 4 is not provided or is placed improperly, the laser beam 6 emitted from one light emitting layer 1a is in some cases not fed back to the light emitting layer 1a from which the beam has been emitted but fed back to another light emitting layer 1a. In such a case, oscillation occurs between two different light emitting layers 1a. Such a phenomenon is called cross-coupling oscillation.

Figure 3:
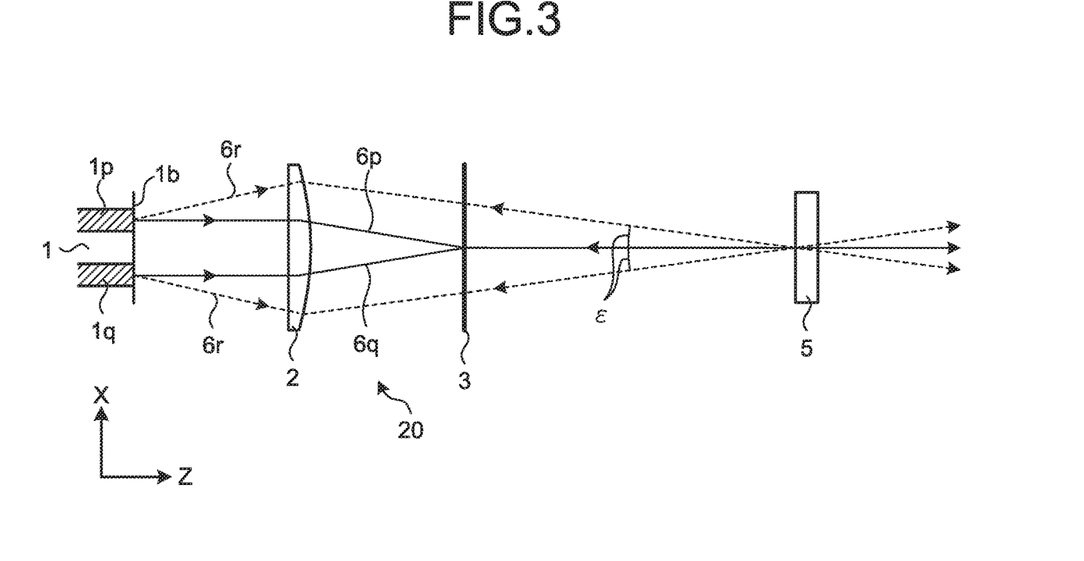
FIG. 3 is a diagram for explaining the behavior of laser beams in cross-coupling oscillation.

FIG. 3 is a diagram for explaining the behavior of the laser beams 6 in the cross-coupling oscillation. A wavelength combining laser apparatus 20 illustrated in FIG. 3 does not have the cross-coupling reduction optical system 4. Also in FIG. 3, the effect of diffraction in the wavelength combining element 3 is simplified, and the LD bar 1 to the partially-reflective mirror 5 are arranged in a straight line. As for light emitting layers of the LD bar 1, only two light emitting layers 1p and 1q of interest are illustrated. Chief rays 6p and 6q indicated y b the solid lines are laser beams emitted from the corresponding light emitting layers 1p and 1q and represent optical paths of normal oscillation that is not the cross-coupling oscillation. Rays 6r indicated by the dashed lines represent optical paths of the cross-coupling oscillation.

The ray 6r emitted at an angle from the light emitting layer 1p enters the partially-reflective mirror 5 at an incident angle ε, is reflected thereby at a reflection angle ε, and is fed back to the light emitting layer 1q. Conversely, the ray Or emitted from the light emitting layer 1q is fed back to the light emitting layer 1p. The ray 6r thus travels back and forth between the light emitting layer 1p and the light emitting layer 1q. At this time, a portion of the chief rays 6p and 6q is transmitted straight through the partially-reflective mirror 5, whereas a portion of the ray 6r of the cross-coupling oscillation is transmitted through the partially-reflective mirror 5 while being shifted by the angle ε. That is, when the cross-coupling oscillation occurs, the laser beam emitted from the partially-reflective mirror 5 spreads more than the laser beam of the normal oscillation, whereby the beam quality is reduced.

When the wavelengths of the chief rays 6p and 6q are λp and λq, respectively, the wavelength of the ray 6r of the cross-coupling oscillation is roughly in the middle between λp and λq, or (λp+λq)/2. Therefore, one can know whether or not the cross-coupling oscillation is occurring by measuring the wavelength spectrum of the laser beam being emitted.

Figure 4:
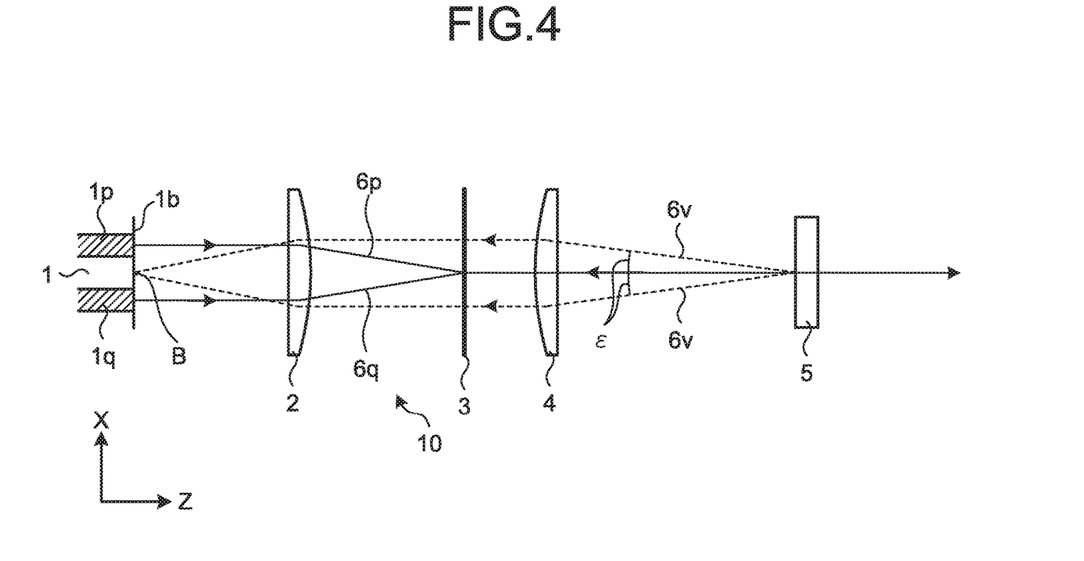
FIG. 4 is a diagram for explaining the function of a cross-coupling reduction optical system in the wavelength combining laser apparatus according to the first embodiment.

FIG. 4 is a diagram for explaining the function of the cross-coupling reduction optical system 4 in the wavelength combining laser apparatus 10 according to the first embodiment. In FIG. 4, as with FIG. 3, the effect of diffraction in the wavelength combining element 3 is simplified, and the LD bar 1 to the partially-reflective mirror 5 are arranged in a straight line.

When the cross-coupling reduction optical system 4 is formed of a lens, the cross-coupling reduction optical system 4 is made of quartz or glass. The cross-coupling reduction optical system 4 has a convex power, that is, a positive power, in a laser beam combining direction 400 (see FIG. 1) that is perpendicular to both the direction of the optical axis of the single laser beam 6 combined in the wavelength combining element 3 and emitted therefrom and the thickness direction of the LD bar 1. The laser beam combining direction 400 is a direction in the cross-coupling reduction optical system 4 corresponding to the width direction of the LD bar 1 that emits the plurality of laser beams 6 combined by the wavelength combining element 3.

A lens system of the external resonator optical path combining the cross-coupling reduction optical system 4 and the focusing element 2 allows the light emitting end face 1b of the LD bar 1 to be conjugate to the partially-reflective mirror 5 in a plane formed by the direction of the optical axis of the single laser beam 6 and the laser beam combining direction 400, that is, in an XZ plane. In other words, the lens system images the light emitting end face 1b on the partially-reflective mirror 5 in the XZ plane.

As with FIG. 3, the chief rays 6p and 6q indicated by the solid lines in FIG. 4 are the laser beams emitted from the corresponding light emitting layers 1p and 1q and represent the optical paths of normal oscillation. Rays 6v indicated by the dashed lines in FIG. 4 are imaginary rays obtained with reference to the rays 6r in FIG. 3 and entering and being reflected by the partially-reflective mirror 5 at the incident angle ε and the reflection angle ε. One can see from FIG. 4 that the ray 6v is fed back to a central point B between the light emitting layer 1p and the light emitting layer 1q. The position of point B to which the ray is fed back does not depend on the magnitude of the angle ε, whereby the ray 6v that is the laser beam of the cross-coupling oscillation cannot exist.

The function of the cross-coupling reduction optical system 4 will be described by another method. As described above, the lens system of the external resonator optical path combining the cross-coupling reduction optical system 4 and the focusing element 2 images the light emitting end face 1b of the LD bar 1 on the partially-reflective mirror 5 in the XZ plane. Here, when the cross-coupling oscillation occurs, the light emitting layer 1p and the light emitting layer 1q oscillate at the same wavelength (λp+λq)/2, so that the images of the light emitting layer 1p and the light emitting layer 1q on the partially-reflective mirror 5 need to be separated by the pitch of the light emitting layer 1p and the light emitting layer 1q. That is, the images of the light emitting layer 1p and the light emitting layer 1q do not overlap on the partially-reflective mirror 5, whereby the laser beam 6 reflected by the partially-reflective mirror 5 is not fed back to the light emitting layer 1a different from the light emitting layer from which the beam has been emitted but can be fed back only to the light emitting layer is from which the beam has been emitted. As a result, the cross-coupling oscillation does not occur, and the laser beam 6 exiting the partially-reflective mirror 5 is only the laser beam 6 of the normal oscillation.

Figure 5:
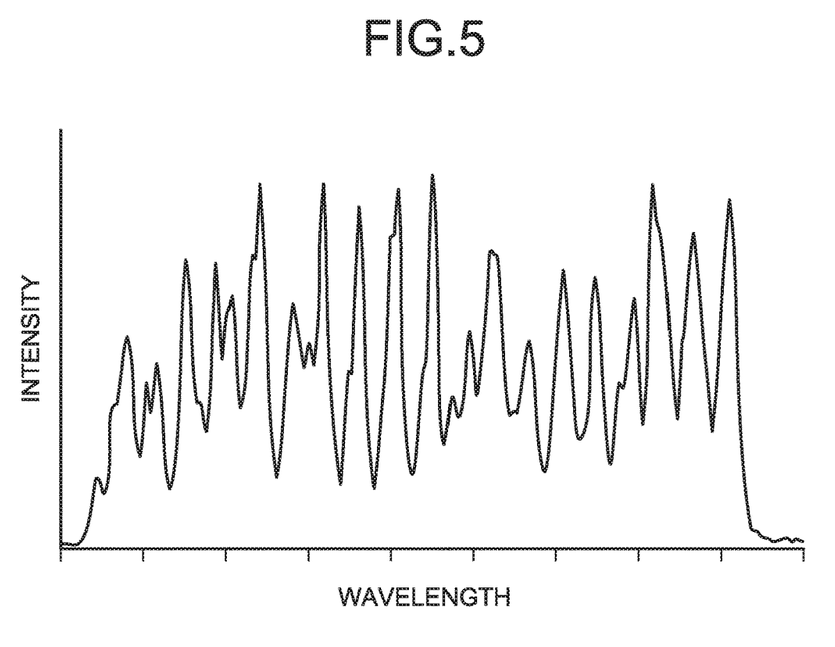
FIG. 5 is a graph illustrating a wavelength spectrum of a wavelength combining laser apparatus illustrated in FIG. 3.
Figure 6:
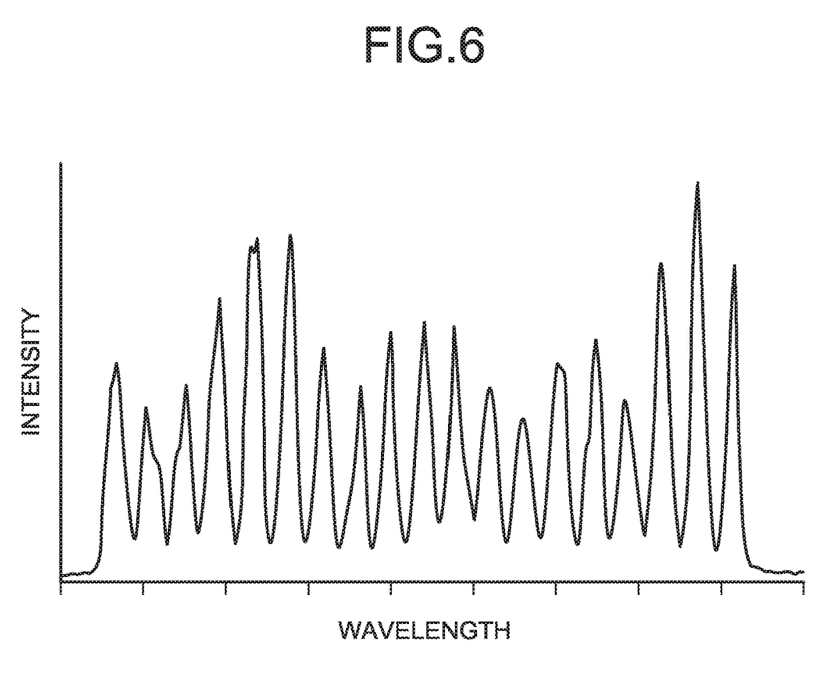
FIG. 6 is a graph illustrating a wavelength spectrum of the wavelength combining laser apparatus illustrated in FIG. 4.

FIG. 5 is a graph illustrating the wavelength spectrum of the wavelength combining laser apparatus 20 illustrated in FIG. 3. FIG. 6 is a graph illustrating the wavelength spectrum of the wavelength combining laser apparatus 10 illustrated in FIG. 4. In FIGS. 5 and 6, the horizontal axis represents the wavelength, and the vertical axis represents the intensity. FIG. 6 illustrates the effect of the wavelength combining laser apparatus 10 according to the first embodiment.

The wavelength combining laser apparatus 20 illustrated in FIG. 3 and the wavelength combining laser apparatus 10 illustrated in FIG. 4 both use the LD bar 1 having 19 light emitting layers 1a. One can see that, in FIG. 5, the wavelength spectrum is disturbed since the cross-coupling oscillation is not successfully reduced, whereas in FIG. 6, 19 separate peaks can be clearly recognized as the cross-coupling oscillation is successfully reduced.

That is, the wavelength combining laser apparatus 10 according to the first embodiment is provided with the cross-coupling reduction optical system 4 to cause the light emitting end face 1b of the LD bar 1 to be conjugate to the partially-reflective mirror 5, that is, image the light emitting end face 1b on the partially-reflective mirror 5, in the plane formed by the direction of the optical axis and the laser beam combining direction 400. This reduces the cross-coupling oscillation, and high beam quality can be obtained. Moreover, although the electro-optical conversion efficiency of the LD bar 1 decreases when the cross-coupling oscillation occurs, the electro-optical conversion efficiency originally exhibited by the LD bar 1 can be obtained by reducing the cross-coupling oscillation. Furthermore, the laser beam due to the cross-coupling oscillation is wasteful light that lowers the beam quality, so that, by reducing the cross-coupling oscillation, the use efficiency of the laser beam contributing to laser machining can be increased.

In the wavelength combining laser apparatus 10 according to the first embodiment, the light emitting end face 1b of the LD bar 1 is imaged on the partially reflective mirror 5 simply by disposing the cross-coupling reduction optical system 4. Therefore, the wavelength combining laser apparatus 10 has simple and easy configuration without the necessity of including an opening or slit for shutting off the optical path of the cross-coupling oscillation, a locking arm that is an additional optical path for fixing the oscillation wavelength of the laser beam 6, or the like. AS a result, the wavelength combining laser apparatus 10 is low in cost and can reduce the cross-coupling oscillation stably even against manufacturing errors.

Figure 7:
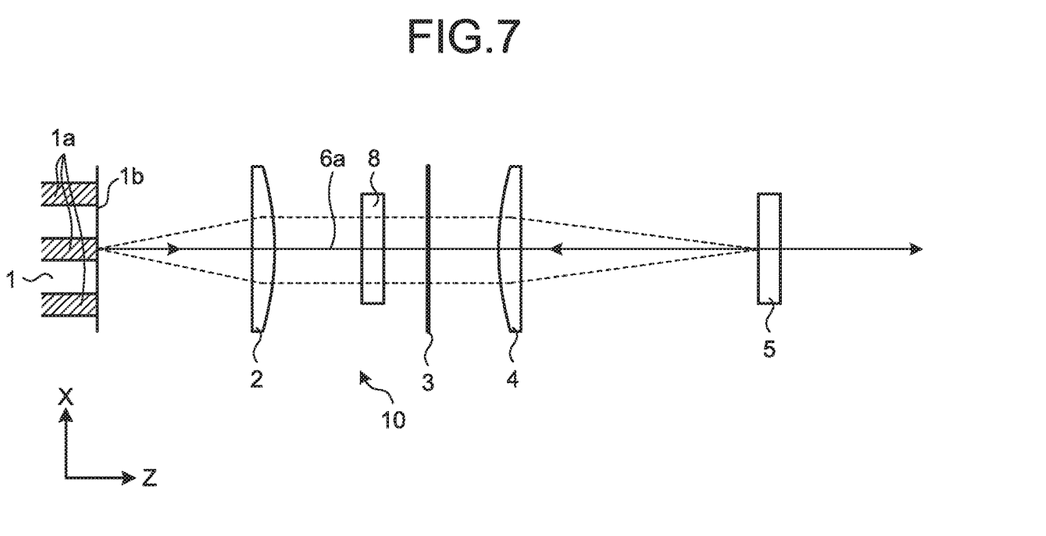
FIG. 7 is a diagram illustrating a state in which a half-wave plate is disposed in the wavelength combining laser apparatus according to the first embodiment.

A half-wave plate may be disposed between the LD bar 1 and the wavelength combining element 3, more specifically between the focusing element 2 and the wavelength combining element 3. FIG. 7 is a diagram illustrating a state in which a half-wave plate 8 is disposed in the wavelength combining laser apparatus 10 according to the first embodiment. When the half-wave plate 8 provided between the focusing element 2 and the wavelength combining element 3 causes the polarization direction of the laser beam 6 to be rotated 90 degrees around the optical axis, the diffraction efficiency of the wavelength combining element 3 is increased more easily, so that the wavelength combining laser apparatus 10 having high efficiency can be obtained.

The wavelength combining laser apparatus 10 may also include a plurality of the LD bars 1 as the semiconductor lasers. The LD bars 1 are disposed such that the chief rays 6a of the laser beams 6 emitted from all the LD bars 1 gather at one point A on the wavelength combining element 3. The laser beams 6 of the plurality of LD bars 1 are superimposed into a single laser beam, whereby the wavelength combining laser apparatus 10 can obtain high power.

Second Embodiment

Figure 8:
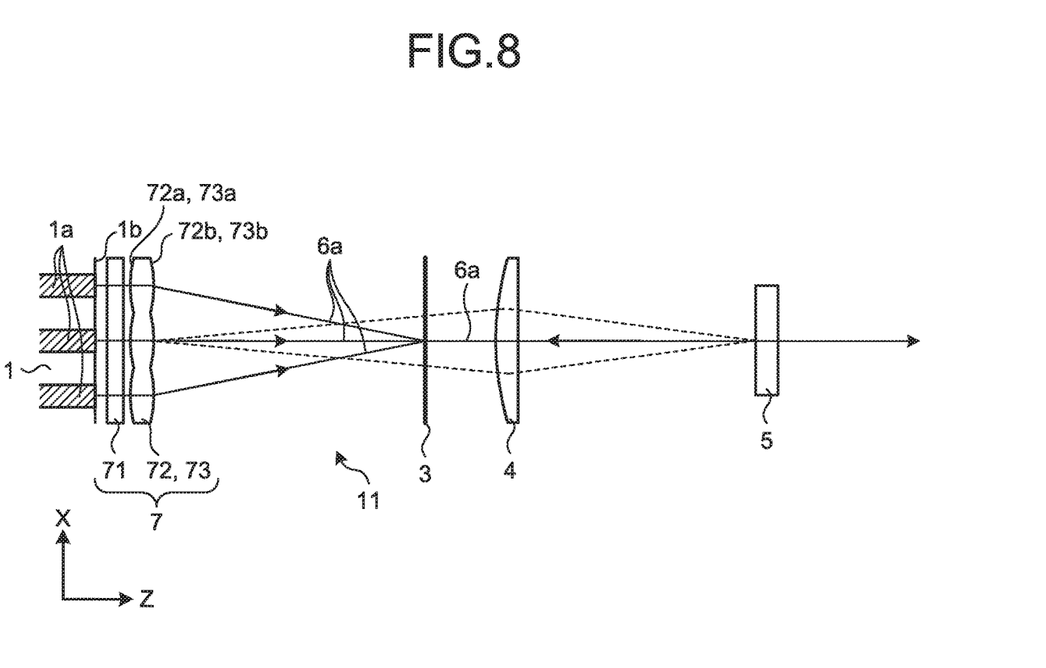
FIG. 8 is a diagram illustrating the configuration of a wavelength combining laser apparatus according to a second embodiment of the present invention.

FIG. 8 is a diagram illustrating the configuration of a wavelength combining laser apparatus 11 according to a second embodiment of the present invention. In FIG. 8, components identical to the components in FIGS. 1 and 4 are assigned the same reference numerals as those in FIGS. 1 and 4. The wavelength combining laser apparatus 11 illustrated in the second embodiment includes a beam shaping element 7. That is, the LD bar 1 of the wavelength combining laser apparatus 11 includes the beam shaping element 7 facing the light emitting end face 1b. The beam shaping element 7 collimates the plurality of laser beams 6 emitted from the LD bar 1 as divergent light from the light emitting layers 1a, which are arrayed at equal pitches in the X direction that is the width direction of the LD bar 1, and reduces the divergence angle before the plurality of laser beams 6 overlaps one another. The plurality of laser beams 6 collimated by the beam shaping element 7 enter the wavelength combining element 3. FIG. 8 illustrates only three of the light emitting layers 1a for simplicity Details of the beam shaping element 7 will be described below with reference to FIGS. 9 and 10.

Figure 9:
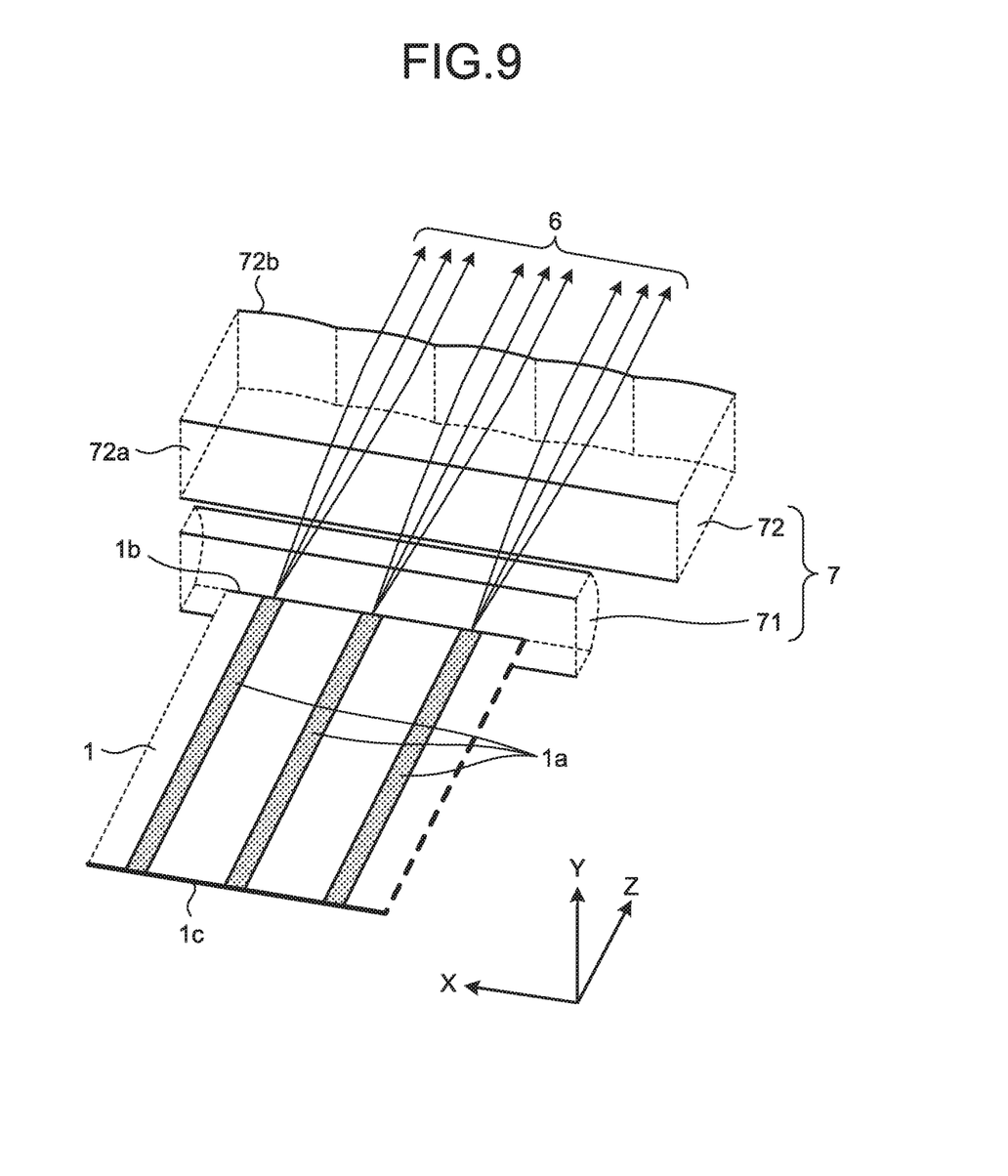
FIG. 9 is an enlarged view of an example of an LD bar and a beam shaping element according to the second embodiment.
Figure 10:
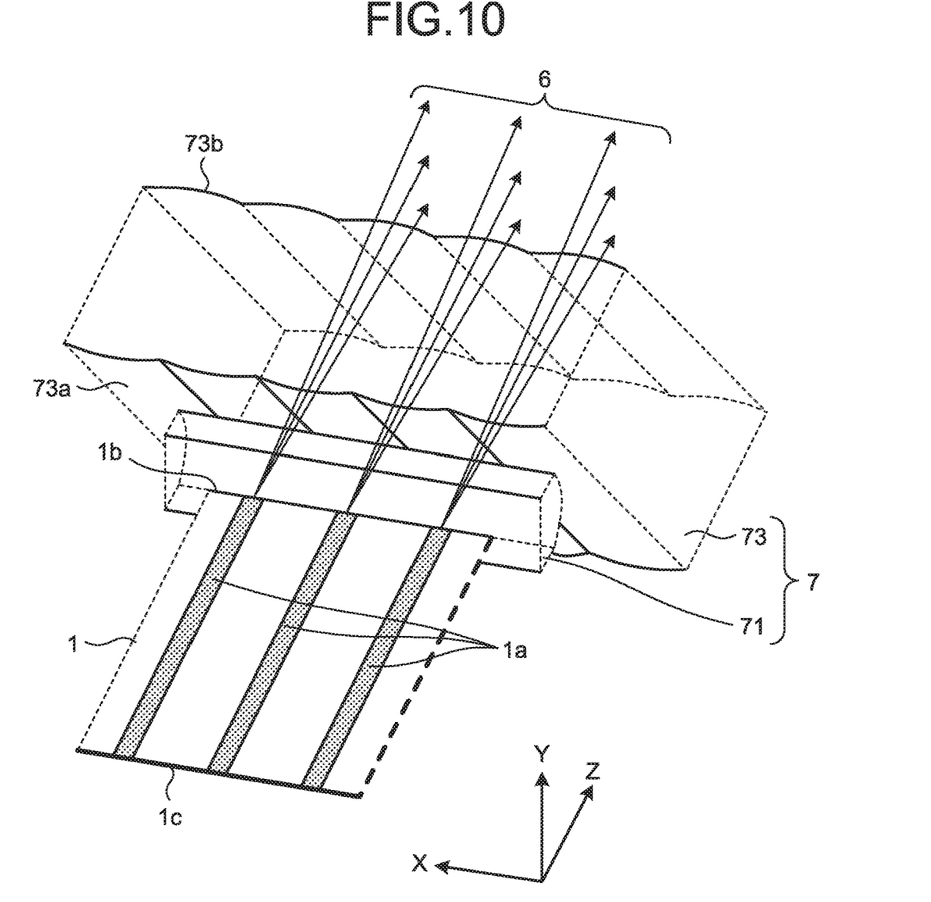
FIG. 10 is an enlarged view of another example of the LD bar and the beam shaping element according to the second embodiment.

FIG. 9 is an enlarged view of an example of the LD bar 1 and the beam shaping element 7 according to the second embodiment. FIG. 10 is an enlarged view of another example of the LD bar 1 and the beam shaping element 7 according to the second embodiment. FIGS. 9 and 10 illustrate two different types of the beam shaping elements 7.

The width of the light emitting layer 1a of the LD bar 1 is usually 50 μm to 200 μm, and the divergence angle of the laser beam 6 emitted from the light emitting layer 1a in the width direction (X direction) of the LD bar 1 is 7 degrees to 11 degrees. The thickness of the light emitting layer 1a is about 1 μm, and the divergence angle of the laser beam 6 emitted in the thickness direction (Y direction) of the light emitting layer 1a is 45 degrees to 60 degrees. The direction in which the divergence angle of the laser beam 6 is small is called a slow axis direction, and the direction in which the divergence angle of the laser beam 6 is large is called a fast axis direction. Thus, the width direction (X direction) of the LD bar 1 corresponds to the slow axis direction, and the thickness direction (Y direction) of the light emitting layer 1a corresponds to the fast axis direction. That is, the plurality of laser beams 6 are emitted from the plurality of light emitting layers 1a aligned in the width direction (slow axis direction) of the LD bar 1, where the individual laser beams 6 have two directions corresponding to different divergence angles, that is, the slow axis direction and the fast axis direction.

In order to collimate such laser beams 6, for example, the beam shaping element 7 illustrated in FIG. 9 is used. The beam shaping element 7 includes two lenses, or a Fast Axis Collimator (FAC) 71 for performing collimation in the fast axis direction and a Slow Axis Collimator (SAC) 72 for performing collimation in the slow axis direction. The FAC 71 is a cylindrical lens having a generatrix in the X direction. An exit surface 72b of the SAC 72 is a lens array, that is, a microlens array, in which a plurality of cylindrical lens surfaces having generatrices in the Y direction are arranged in the X direction that is the laser beam combining direction. An incident surface 72a of the SAC 72 is a flat surface.

On the other hand, the beam shaping element 7 illustrated in FIG. 10 includes the FAC 71 and an optical path conversion element 73 in place of the SAC 72. The optical path conversion element 73 has a function of switching the slow axis direction and the fast axis direction of the laser beam 6. In other words, after the laser beam 6 passes through the optical path conversion element 73, the slow axis direction of the beam is switched to the Y direction from the X direction and the fast axis direction of the beam is switched to the X direction from the Y direction. In the optical path conversion element 73, an incident surface 73a and an exit surface 73b are each a lens array, that is, a microlens array, in which a plurality of cylindrical lens surfaces are arranged in the X direction that is the laser beam combining direction. Each or the lens surfaces making up the microlens array has a generatrix in the direction of 45 degrees in the XY plane. The individual lens surfaces making up the microlens arrays are arranged to face one another between the incident surface 73a and the exit surface 73b, and the positions of the lens surfaces facing each other coincide in the X direction that is the slow axis direction. The optical path conversion element 73 is also arranged such that the positions of the individual lens surfaces coincide with the positions of emission of the laser beams 6 from the light emitting layers 1a.

The lens surface of each of the FAC 71, the SAC 72, and the optical path conversion element 73 is any of a circular arc, an ellipse, a hyperbola, or a non-circular arc obtained by combining a polynomial with those, where the cross sectional shape perpendicular to the generatrix is convex. Note that when the optical path conversion element 73 is used, a lens for collimating the laser beam 6 in the slow axis direction may be additionally provided in the external resonator optical path.

The wavelength combining laser apparatus 11 can be made compact by using the beam shaping element 7 illustrated in FIG. 9 or 10 to collimate the laser beams 6 and reduce the divergence angles. That is, the wavelength combining laser apparatus 11 can be manufactured at a low cost.

The laser beams 6 collimated by the beam shaping element 7 are emitted from the exit surface 72b of the SAC 72 or the exit surface 73b of the optical path conversion element 73 and then spread again by diffraction. Thus, when including the beam shaping element 7, the wavelength combining laser apparatus 11 can treat the exit surface 72b or 73b as a new light emitting end face of the LD bar 1 and form an image thereof on the partially-reflective mirror 5, thereby being able to reduce the cross-coupling oscillation. That is, the exit surface 72b or 73b is imaged on the partially-reflective mirror 5 by disposing the cross-coupling reduction optical system 4 to cause the exit surface 72b or 73b to be conjugate to the partially-reflective mirror 5 in the plane formed by the direction of the optical axis and the laser beam combining direction. The dashed lines in FIG. 8 are the divergent light indicating that the exit surface 72b or 73b is imaged on the partially-reflective mirror 5. The solid lines are the chief rays 6a of the laser beams 6. In reality, the beam shaping element 7 is sufficiently small relative to the wavelength combining laser apparatus 10, so that the cross-coupling reduction optical system 4 may be disposed to image the light emitting end face 1b of the LD bar 1 on the partially-reflective mirror 5 while ignoring the beam shaping element 7.

Moreover, the chief rays 6a of the laser beams 6 emitted from the light emitting layers 1a can be gathered at one point A on the wavelength combining element 3 by shifting the pitch of the SAC 72 or inclining the generatrix of the FAC 71 in the XY plane. That is, the focusing element 2 included in the wavelength combining laser apparatus 10 according to the first embodiment is not an indispensable component and may be removed, as illustrated in FIG. 8. When the focusing element 2 is not used, as illustrated in FIG. 8, the cross-coupling reduction optical system 4 alone images the exit surface 72b of the SAC 72 or the exit surface 73b of the optical path conversion element on the partially-reflective mirror 5 in the XZ plane.

As described above, according to the wavelength combining laser apparatus 11 of the second embodiment, the cross-coupling reduction optical system 4 causes the exit surface 72b of the SAC 72 or the exit surface 73b of the optical path conversion element 73 to be conjugate to the partially-reflective mirror 5, that is, images the exit surface 72b or 73b on the partially-reflective mirror 5, in the plane formed by the direction of the optical axis and the laser beam combining direction, whereby the cross-coupling oscillation is reduced while at the same time the wavelength combining laser apparatus 11 can be made compact and inexpensive.

Third Embodiment

Figure 11:
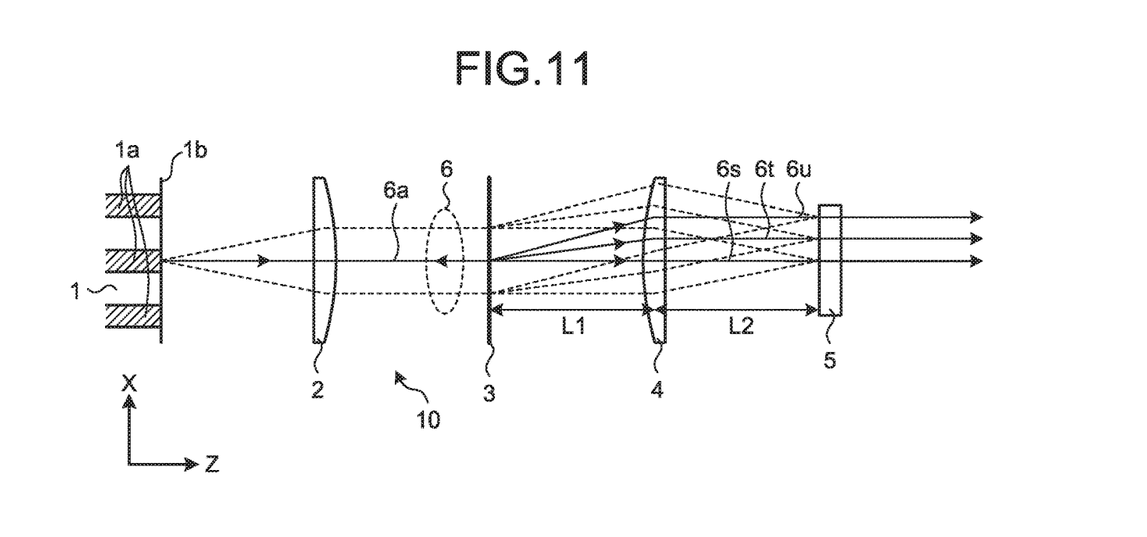
FIG. 11 is a diagram for explaining how the beam quality is reduced in the wavelength combining laser apparatus according to the first embodiment.

FIG. 11 is a diagram for explaining how the beam quality is reduced in the wavelength combining laser apparatus 10 according to the first embodiment. The beam quality may be reduced under the following conditions even though the cross-coupling oscillation can be reduced by the cross-coupling reduction optical system 4 included in the wavelength combining laser apparatus 10 according to the first embodiment and the wavelength combining laser apparatus 11 according to the second embodiment.

FIG. 11 is a diagram for explaining reduction of the beam quality due to the cross-coupling reduction optical system 4 in the wavelength combining laser apparatus 10 according to the first embodiment. FIG. 11 illustrates only three of the light emitting layers 1a for simplicity. Considering only the laser beam 6 emitted from the middle light emitting layer 1a, the solid line is the chief ray 6a, and the dashed lines are the divergent light indicating that the light emitting end face 1b is imaged on the partially-reflective mirror 5. The cross-coupling reduction optical system 4 is a single lens in the wavelength combining laser apparatus 10. As described above, the cross-coupling reduction optical system 4 has a convex power, that is, a positive power, in the laser beam combining direction 400 that is perpendicular to both the direction of the optical axis of the single laser beam 6 combined in the wavelength combining element 3 and the thickness direction of the LD bar 1.

In FIG. 11, it is assumed that "f" is the focal length of the cross-coupling reduction optical system 4 in the laser beam combining direction, "L1" is the interval between the wavelength combining element 3 and the cross-n coupling reduction optical system 4, and "L2" is the interval between the cross-coupling reduction optical system 4 and the partially-reflective mirror 5. In the wavelength combining laser apparatus 10 of FIG. 11, the cross-coupling reduction optical system 4 and the partially-reflective mirror 5 are arranged to satisfy L1=L2=f.

When the cross-coupling reduction optical system 4 and the partially-reflective mirror 5 are arranged as illustrated in FIG. 11, a plurality of rays $6s$ (with the wavelength of $\lambda s$), $6t$ (with the wavelength of $\lambda t$), and $6u$ (with the wavelength of $\lambda u$) diffracted by the wavelength combining element 3 and having different wavelengths can be fed back to the original light emitting layer $1a$. That is, one light emitting layer $1a$ oscillates in a wide continuous wavelength range, so that the beam diameter of the laser beam 6 is widely spread on the partially-reflective mirror 5. For this reason, the beam quality of the laser beam emitted from the partially-reflective mirror 5 is reduced.

The reduction of the beam quality can be avoided when the relationship of L1<<L2 is satisfied. As the difference between L1 and L2 is increased, the wavelength width per light emitting layer $1a$ can be reduced. As a result, the beam diameter of the laser beam 6 on the partially-reflective mirror 5 is reduced, and the beam quality of the laser beam 6 emitted from the partially-reflective mirror 5 is improved. In FIG. 11, the difference between L1 and L2 is increased when the cross-coupling reduction optical system 4 is brought closer to the wavelength combining element 3 to have L1 close to zero and increase L2 (=f). However, since L1 does not become zero or smaller, the wavelength combining laser apparatus 10 is increased in size as a whole.

Figure 12:
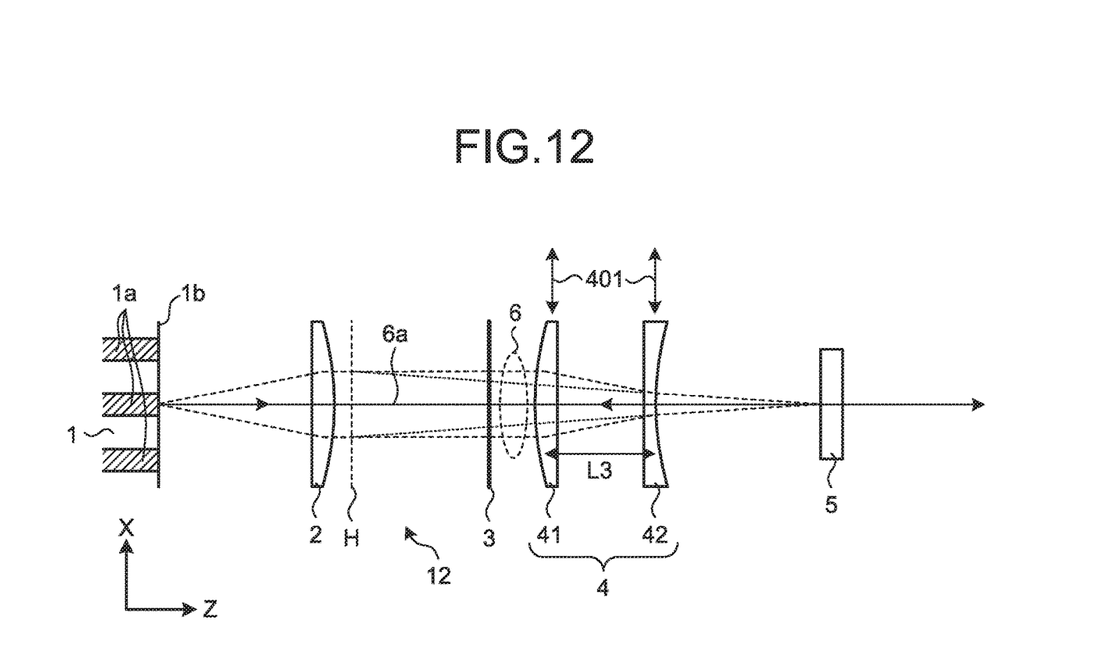
FIG. 12 is a diagram illustrating the configuration of a wavelength combining laser apparatus according to a third embodiment of the present invention.
Figure 13:
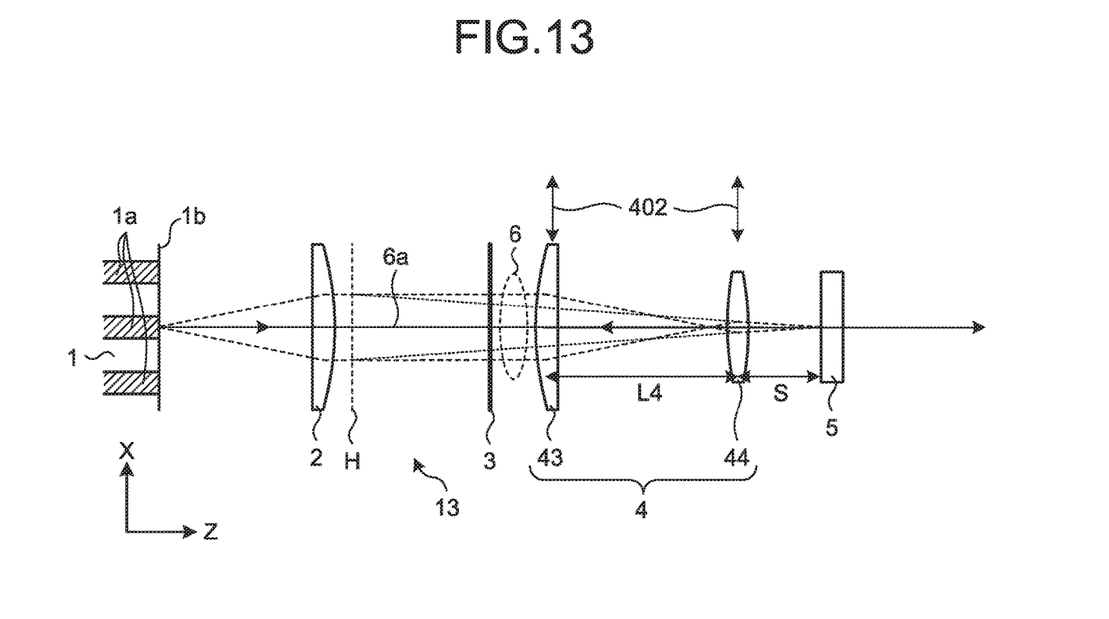
FIG. 13 is a diagram illustrating the configuration of another wavelength combining laser apparatus according to the third embodiment.

FIG. 12 is a diagram illustrating the configuration of a wavelength combining laser apparatus 12 according to a third embodiment of the present invention. FIG. 13 is a diagram illustrating the configuration of another wavelength combining laser apparatus 13 according to the third embodiment. The wavelength combining laser apparatuses 12 and 13 according to the third embodiment of the present invention can obtain good beam quality by avoiding the above conditions without increasing the external resonator optical path.

In the wavelength combining laser apparatus 12 of FIG. 12, the cross-coupling reduction optical system 4 includes two lenses, i.e., a convex lens 41 and a concave lens 42. The convex lens 41 and the concave lens 42 have powers in a laser beam combining direction 401 (see FIG. 12) that is perpendicular to both the direction of the optical axis of the single laser beam 6 combined in the wavelength combining element 3 and the thickness direction of the LD bar 1. The convex lens 41 as a first lens is disposed on the side close to the wavelength combining element 3, and the concave lens 42 as a second lens is disposed on the side close to the partially-reflective mirror 5. When the focal length of the convex lens 41 in the laser beam combining direction 401 is defined as a first focal length f1 and the focal length of the concave lens 42 in the laser beam combining direction 401 is defined as a second focal length f2, the interval L3 between the convex lens 41 and the concave lens 42 satisfies L3>f1+f2. In other words, the cross-coupling reduction optical system is not an afocal telescope that satisfies L3=f1+f2. With such lens arrangement, a main lens surface H when the convex lens 41 and the concave lens 42 are combined can be positioned on the side closer to the LD bar 1 than the wavelength combining element 3. The wavelength combining laser apparatus 12 of FIG. 12 can thus have the configuration equivalent to the arrangement in which the cross-coupling reduction optical system 4 including one lens in FIG. 11 is disposed at the main lens surface H. That is, the wavelength combining laser apparatus 12 of FIG. 12 can realize the configuration equivalent to having L1<0 and increasing the difference between L1 and L2 in FIG. 11.

In the wavelength combining laser apparatus 13 of FIG. 13, the cross-coupling reduction optical system 4 includes two convex lenses 43 and 44. The convex lenses 43 and 44 have powers in a laser beam combining direction 402 (see FIG. 13) that is perpendicular to both the direction of the optical axis of the single laser beam 6 combined in the wavelength combining element 3 and the thickness direction of the LD bar 1. The convex lens 43 as a first lens is disposed on the side close to the wavelength combining element 3, and the convex lens 44 as a second lens is disposed on the side close to the partially-reflective mirror 5. When the focal length of the convex lens 43 in the laser beam combining direction 402 is defined as a first focal length f3 and the focal length of the convex lens 44 in the laser beam combining direction 402 is defined as a second focal length f4, the interval L4 between the convex lenses 43 and 44 satisfies L4>f3+f4. In other words, the cross-coupling reduction optical system 4 is not an afocal telescope that satisfies L4=f3+f4. The relationship of f3>f4 is also satisfied. The convex lens 44 has a convex power, that is, a positive power, in the laser beam combining direction 402, and an interval S between the convex lens 44 and the partially-reflective mirror 5 satisfies S>L4−f3. With such lens arrangement, the main lens surface H when the convex lenses 43 and 44 are combined can be positioned on the side closer to the LD bar 1 than the wavelength combining element 3. The wavelength combining laser apparatus 13 of FIG. 13 can thus have the configuration equivalent to the arrangement in which the cross-coupling reduction optical system 4 including one lens in FIG. 11 is disposed at the main lens surface H. That is, the wavelength combining laser apparatus 13 of FIG. 13 can realize the configuration equivalent to having L1<0 and increasing the difference between L1 and L2 in FIG. 11.

As described above, according to the wavelength combining laser apparatuses 12 and 13 of the third embodiment, the cross-coupling reduction optical system 4 is formed using two lenses, so that the cross-coupling oscillation is reduced while at the same time good beam quality can be obtained without increasing the external resonator optical path, that is, without increasing the size of the wavelength combining laser apparatuses 12 and 13.

Although. FIGS. 12 and 13 do not illustrate the beam shaping element 7 illustrated in the second embodiment, the wavelength combining laser apparatuses 12 and 13 according to the third embodiment can obtain the above effect without the beam shaping element 7. When including the beam shaping element 7, the wavelength combining laser apparatuses 12 and 13 according to the third embodiment have good beam quality without the focusing element 2.

Fourth Embodiment

Figure 14:
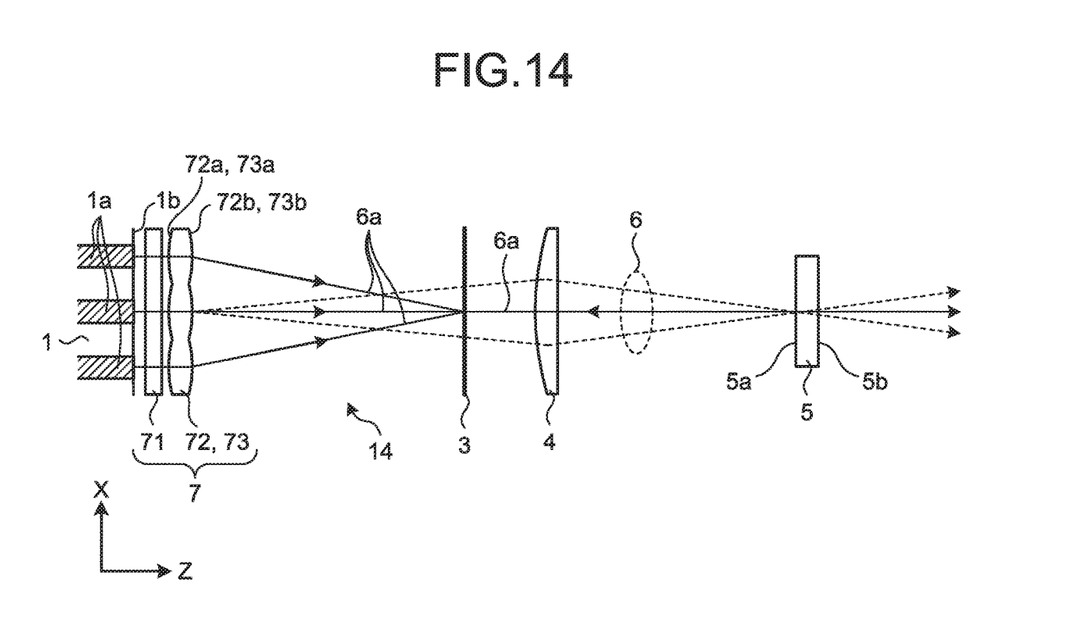
FIG. 14 is a diagram illustrating the configuration of a wavelength combining laser apparatus according to a fourth embodiment of the present invention.
Figure 15:
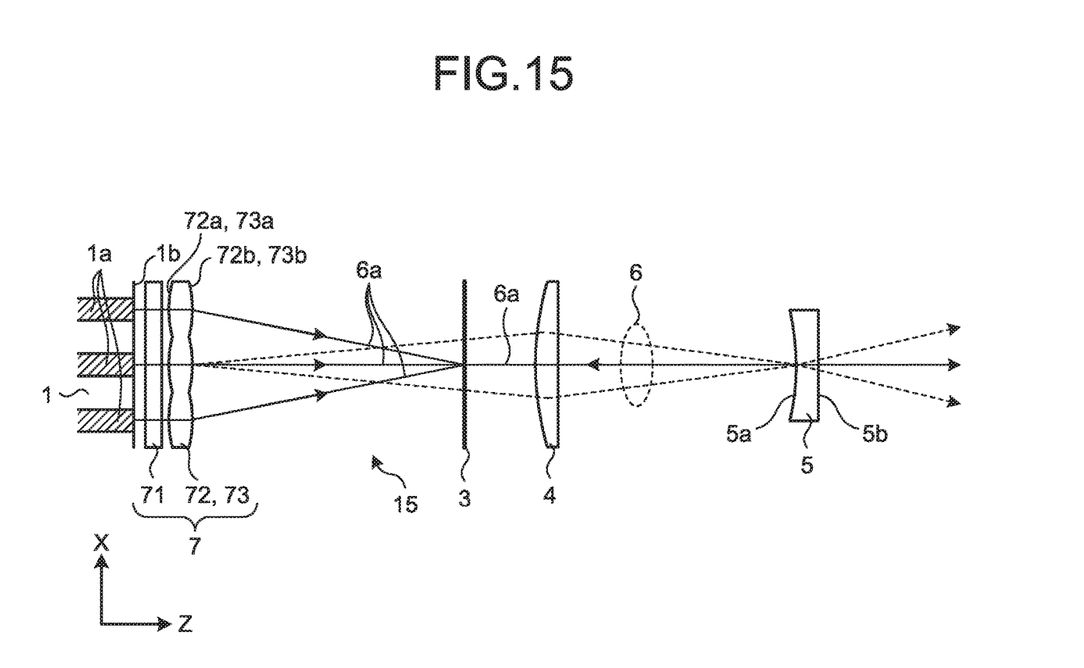
FIG. 15 is a diagram illustrating the configuration of another wavelength combining laser apparatus according to the fourth embodiment.

FIG. 14 is a diagram illustrating the configuration of a wavelength combining laser apparatus 14 according to a fourth embodiment of the present invention. FIG. 15 is a diagram illustrating the configuration of another wavelength combining laser apparatus 15 according to the fourth embodiment.

Referring to FIG. 14, a partial reflection surface $5a$ of the partially-reflective mirror 5 faces the inside of the external resonator optical path, and a total transmission surface Sb of the partially-reflective mirror 5 faces the outside of the external resonator optical path. When the wavelength combining laser apparatus 14 includes a plurality of the LD bars 1, the laser beams 6 of higher power than when including one LD bar 1 are collected on the partial reflection surface 5a of the partially-reflective mirror 5. Note that the total transmission surface 5b includes an anti-reflective film formed by vacuum evaporation or another method.

In the wavelength combining laser apparatus 14 according to the fourth embodiment, the partial reflection surface 5a is an uncoated surface. That is, a film that possibly absorbs the laser beams 6 is eliminated so that damage is less likely to occur even when the laser beams 6 of high power are collected. As a result, in the wavelength combining laser apparatus 14, the laser beams 6 are reflected by the reflectance of about 4% at an interface between the glass material of the partially-reflective mirror 5 and the air and fed back to the light emitting layers 1a, whereby the wavelength combining laser apparatus 14 oscillates.

In the wavelength combining laser apparatus 15 according to the fourth embodiment illustrated in FIG. 15, the partial reflection surface 5a of the partially-reflective mirror 5 facing the inside of the external resonator optical path is a concave surface. That is, the partial reflection surface 5a has a negative power. The concave surface of the partial reflection surface 5a spreads the laser beams 6 on the total transmission surface 5b, whereby the energy density can be reduced and damage on the total transmission surface Sb is less likely to occur.

That is, the partial reflection surface 5a of the partially-reflective mirror 5 is formed as the uncoated surface in the wavelength combining laser apparatus 14 of the fourth embodiment, and the partial reflection surface 5a is formed as the concave surface in the wavelength combining laser apparatus 15 of the fourth embodiment, whereby the cross-coupling oscillation can be reduced while at the same time damage to the partially-reflective mirror 5 is reduced to be able to achieve long service life thereof.

Note that the partial reflection surface 5a and the total transmission surface 5b may be arranged in reverse positions. That is, the total transmission surface may face the inside of the external resonator optical path and the partial reflection surface may face the outside of the external resonator optical path. Moreover, although the focusing element 2 is not illustrated in FIGS. 14 and 15, the above effect can be obtained with or without the focusing element 2. When including the focusing element 2, the wavelength combining laser apparatuses 14 and 15 according to the fourth embodiment can reduce damage to the partially-reflective mirror 5 without the beam shaping element 7.

The configurations illustrated in the above embodiments merely illustrate examples of an aspect of the present invention, and can thus be combined with another known technique or partially or and or modified without departing from the scope of the present invention.

REFERENCE SIGNS LIST

1 LD bar; 1a, 1p, 1q light emitting layer; 1b light emitting end face; 1c end face (total reflection mirror); 2 focusing element; 3 wavelength combining element; 4 cross-coupling reduction optical system; 5 partially-reflective mirror; 5a partial reflection surface; 5b total transmission surface; 6 laser beam; 6a, 6i, 6j, 6k, 6p, 6q chief ray; 6r, 6s, 6t, 6u, 6v ray; 7 beam shaping element; 8 half-wave plate; 10, 11, 12, 13, 14, 15, 20 wavelength combining laser apparatus; 41, 43, 44 convex lens; 42 concave lens; 71 FAC; 72 SAC; 72a, 73a incident surface; 72b, 73h exit surface; 73 optical path conversion element; θi, θj, θk incident angle; ψ outgoing angle (diffraction angle); A single point; B point; H main lens surface.

The invention claimed is:

1. A wavelength combining laser apparatus comprising:
a semiconductor laser to emit, in a direction of an optical axis, a plurality of laser beams from a light emitting end face of a plurality of light emitting portions aligned in a laser beam combining direction, the direction of the optical axis being perpendicular to the laser beam combining direction;
a wavelength combining element to combine the plurality of laser beams in the laser beam combining direction into a single laser beam and output the single laser beam;
a cross-coupling reduction optical system having a positive power in the laser beam combining direction perpendicular to an optical axis of the single laser beam that is output from the wavelength combining element; and
a partially-reflective mirror to reflect the single laser beam that passes through the cross-coupling reduction optical system and to allow the single laser beam to transmit through and exit the partially-reflective mirror, wherein
the cross-coupling reduction optical system is disposed to image the light emitting end face on the partially-reflective mirror by causing the light emitting end face to be conjugate to the partially-reflective mirror in a plane formed by the optical axis of the single laser beam and the laser beam combining direction.

2. The wavelength combining laser apparatus according to claim 1, wherein
the cross-coupling reduction optical system includes two lenses that have a power in the laser beam combining direction perpendicular to the direction of the optical axis of the single laser beam, and satisfies a relationship of f1>f2 where f1 is a focal length in the laser beam combining direction of a first lens disposed on a side closer to the wavelength combining element, and f2 is a focal length in the laser beam combining direction of a second lens disposed on a side closer to the partially-reflective mirror, and
an interval L between the first lens and the second lens satisfies L>f1+f2.

3. The wavelength combining laser apparatus according to claim 2, wherein
the second lens has a positive power in the laser beam combining direction, and
an interval S between the second lens and the partially-reflective mirror satisfies S>L−f1.

4. The wavelength combining laser apparatus according to claim 1, wherein
a partial reflection surface of the partially-reflective mirror is uncoated.

5. The wavelength combining laser apparatus according to claim 4, wherein
the partial reflection surface of the partially-reflective mirror has a negative power.

6. The wavelength combining laser apparatus according to claim 1, wherein
a plurality of the semiconductor lasers are included.

7. The wavelength combining laser apparatus according to claim 1, further comprising
a half-wave plate disposed between the semiconductor laser and the wavelength combining element.

8. A wavelength combining laser apparatus comprising:
a semiconductor laser to emit, in a direction of an optical axis, a plurality of laser beams from a light emitting end face of a plurality of light emitting portions aligned in a laser beam combining direction, the direction of the optical axis being perpendicular to the laser beam combining direction;
a beam shaping element that is provided to face the light emitting end face and is a plurality of lens surfaces with exit surfaces aligned in the laser beam combining direction, the exit surfaces collimating the plurality of laser beams and allowing exit of the plurality of laser beams;
a wavelength combining element to combine the plurality of laser beams from the exit surfaces in the laser beam combining direction into a single laser beam and output the single laser beam;
a cross-coupling reduction optical system having a positive power in the laser beam combining direction perpendicular to an optical axis of the single laser beam that is output from the wavelength combining element; and
a partially-reflective mirror to reflect the single laser beam that passes through the cross-coupling reduction optical system and to allow the single laser beam to transmit through and exit the partially-reflective mirror, wherein
the cross-coupling reduction optical system is disposed to image the exit surfaces on the partially-reflective mirror by causing the exit surfaces to be conjugate to the partially-reflective mirror in a plane formed by the optical axis of the single laser beam and the laser beam combining direction.

9. The wavelength combining laser apparatus according to claim 8, wherein
the cross-coupling reduction optical system includes two lenses that have a power in the laser beam combining direction perpendicular to the direction of the optical axis of the single laser beam, and satisfies a relationship of $f1>f2$ where $f1$ is a focal length in the laser beam combining direction of a first lens disposed on a side closer to the wavelength combining element, and $f2$ is a focal length in the laser beam combining direction of a second lens disposed on a side closer to the partially-reflective mirror, and
an interval L between the first lens and the second lens satisfies $L>f1+f2$.

10. The wavelength combining laser apparatus according to claim 9, wherein
the second lens has a positive power in the laser beam combining direction, and
an interval S between the second lens and the partially-reflective mirror satisfies $S>L-f1$.

11. The wavelength combining laser apparatus according to claim 8, wherein
a partial reflection surface of the partially-reflective mirror is uncoated.

12. The wavelength combining laser apparatus according to claim 11, wherein
the partial reflection surface of the partially-reflective mirror has a negative power.

13. The wavelength combining laser apparatus according to claim 8, wherein
a plurality of the semiconductor lasers are included.

14. The wavelength combining laser apparatus according to claim 8, further comprising
a half-wave plate disposed between the semiconductor laser and the wavelength combining element.

* * * * *